US012303946B2

(12) United States Patent
Qiu

(10) Patent No.: US 12,303,946 B2
(45) Date of Patent: May 20, 2025

(54) ULTRASONICALLY ACTIVATED WATER EJECTOR

(71) Applicant: DISCO CORPORATION, Tokyo (JP)

(72) Inventor: Xiaoming Qiu, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 325 days.

(21) Appl. No.: 18/056,108

(22) Filed: Nov. 16, 2022

(65) Prior Publication Data

US 2023/0173552 A1 Jun. 8, 2023

(30) Foreign Application Priority Data

Dec. 2, 2021 (JP) ................................. 2021-196295

(51) Int. Cl.
| | | |
|---|---|---|
| *B08B 3/12* | (2006.01) | |
| *B05B 1/08* | (2006.01) | |
| *B05B 17/06* | (2006.01) | |
| *B08B 3/02* | (2006.01) | |
| *B08B 13/00* | (2006.01) | |
| *B08B 17/06* | (2006.01) | |
| *H01L 21/67* | (2006.01) | |
| *H01L 21/683* | (2006.01) | |

(52) U.S. Cl.
CPC ............... *B08B 3/12* (2013.01); *B05B 1/086* (2013.01); *B08B 3/02* (2013.01); *B08B 13/00* (2013.01); *B08B 17/06* (2013.01); *H01L 21/67051* (2013.01); *H01L 21/6838* (2013.01); *B08B 2203/0288* (2013.01)

(58) Field of Classification Search
CPC ..... B08B 3/12; B08B 3/02; B08B 2203/0288; B08B 13/00; B05B 1/086; B05B 17/06; H01L 21/67051; H01L 21/6838
See application file for complete search history.

(56) References Cited

U.S. PATENT DOCUMENTS

2020/0185202 A1* 6/2020 Widlow .............. C23C 16/4404
2021/0339428 A1* 11/2021 Qiu ...................... B28D 5/0076

FOREIGN PATENT DOCUMENTS

| JP | 2000216126 A | * | 8/2000 |
| JP | 2020000995 A | | 1/2020 |
| JP | 2020044460 A | | 3/2020 |

OTHER PUBLICATIONS

JP2000216126 translation (Year: 2000).*

* cited by examiner

*Primary Examiner* — Michael E Barr
*Assistant Examiner* — Lauren G Orta
(74) *Attorney, Agent, or Firm* — Greer Burns & Crain Ltd.

(57) ABSTRACT

An ultrasonically activated water ejector includes a cylindrical water reservoir section configured to temporarily hold water, an ejection nozzle that ejects the water from a lower part of the water reservoir section, a dome-shaped ultrasonic vibration plate disposed in an upper part of the water reservoir section, facing the ejection nozzle, and having a concave spherical surface on a lower side thereof, and a water supply portion having a supply inlet configured to supply the water along the concave spherical surface into the water reservoir section from an outer periphery toward a center of the ultrasonic vibration plate. The water is supplied from the supply inlet to the water reservoir section in an amount greater than the water to be ejected from the ejection nozzle. The water flows along the concave spherical surface from the outer periphery toward the center, and is held in the water reservoir section.

5 Claims, 5 Drawing Sheets

ULTRASONICALLY ACTIVATED WATER EJECTOR

BACKGROUND OF THE INVENTION

Field of the Invention

The present invention relates to an ultrasonically activated water ejector.

Description of the Related Art

Ultrasonically activated water ejectors for use when cleaning workpieces are disclosed in JP 2020-000995 A and JP 2020-044460 A. These ultrasonically activated water ejectors each include a water reservoir section having an ejection nozzle in a lower part thereof and configured to temporarily hold water, and a dome-shaped ultrasonic vibration plate having a concave spherical surface disposed facing the ejection nozzle and configured to propagate ultrasonic vibrations to the water held in the water reservoir section. The ultrasonic vibrations are propagated from the concave spherical surface to the water held in the water reservoir section, and the resulting ultrasonically activated water is ejected from the ejection nozzle to clean a surface of a workpiece.

SUMMARY OF THE INVENTION

The ultrasonically activated water ejectors are each arranged above a table, and the ultrasonically activated water is ejected from the ultrasonically activated water ejector toward the workpiece held on the table. In this arrangement, the dome-shaped ultrasonic vibration plate is disposed such that the concave spherical surface is directed downward facing the ejection nozzle. Air may therefore be trapped underneath the concave spherical surface.

This air absorbs ultrasonic vibrations, and hence may make it difficult to propagate ultrasonic vibrations to water that is temporarily held in the water reservoir section. Accordingly, no sufficient ultrasonic vibrations may propagate to the water to be ejected from the ejection nozzle, possibly leading to a reduction in cleaning performance.

The present invention therefore has, as an object thereof, the provision of an ultrasonically activated water ejector, which can eject ultrasonically activated water, with ultrasonic vibrations sufficiently propagated thereto, from an ejection nozzle by suppressing trapping of air underneath a concave spherical surface of an ultrasonic vibration plate.

In accordance with an aspect of the present invention, there is provided an ultrasonically activated water ejector for ejecting ultrasonically activated water with ultrasonic vibrations propagated thereto. The ultrasonically activated water ejector includes a cylindrical water reservoir section configured to temporarily hold water supplied from a water supply source, an ejection nozzle that ejects the water from a lower part of the water reservoir section, a dome-shaped ultrasonic vibration plate disposed in an upper part of the water reservoir section, facing the ejection nozzle, and having a concave spherical surface on a lower side thereof, and a water supply portion having a supply inlet configured to supply the water along the concave spherical surface into the water reservoir section from an outer periphery toward a center of the ultrasonic vibration plate. The water is supplied from the supply inlet to the water reservoir section in an amount greater than the water to be ejected from the ejection nozzle. The water flows along the concave spherical surface from an outer periphery toward a center of the concave spherical surface, and is held in the water reservoir section. The ultrasonically activated water is obtained by propagating ultrasonic vibrations from the ultrasonic vibration plate to the water held in the water reservoir section, and is ejected from the ejection nozzle.

Preferably, the supply inlet may be an annular supply inlet opening in a ring shape into the water reservoir section, and the annular supply inlet, the concave spherical surface, and the water reservoir section may be configured such that the water supplied from the annular supply inlet into the water reservoir section flows along the concave spherical surface from an entirety of the outer periphery toward the center of the concave spherical surface, is held in the water reservoir section, and is allowed to flow downward from the center of the concave spherical surface toward the ejection nozzle, the ultrasonic vibrations are allowed to propagate to the water held in the water reservoir section, and the resulting ultrasonically activated water is ejected from the ejection nozzle.

With the ultrasonically activated water ejector, the water supplied from the supply inlet of the water supply portion into the water reservoir section flows along the concave spherical surface of the ultrasonic vibration plate from the outer periphery toward the center of the concave spherical surface. Even if air is trapped underneath the concave spherical surface, it is therefore possible to remove the air from the concave spherical surface with the water that is flowing from the outer periphery to the center of the concave spherical surface, and to discharge it along with the water from the ejection nozzle.

With the ultrasonically activated water ejector, air can be suppressed from being trapped underneath the concave spherical surface of the ultrasonic vibration plate as described above. Ultrasonic vibrations can therefore propagate well to the water held in the water reservoir section. Accordingly, the ultrasonically activated water with ultrasonic vibrations propagated sufficiently thereto can be ejected from the ejection nozzle.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
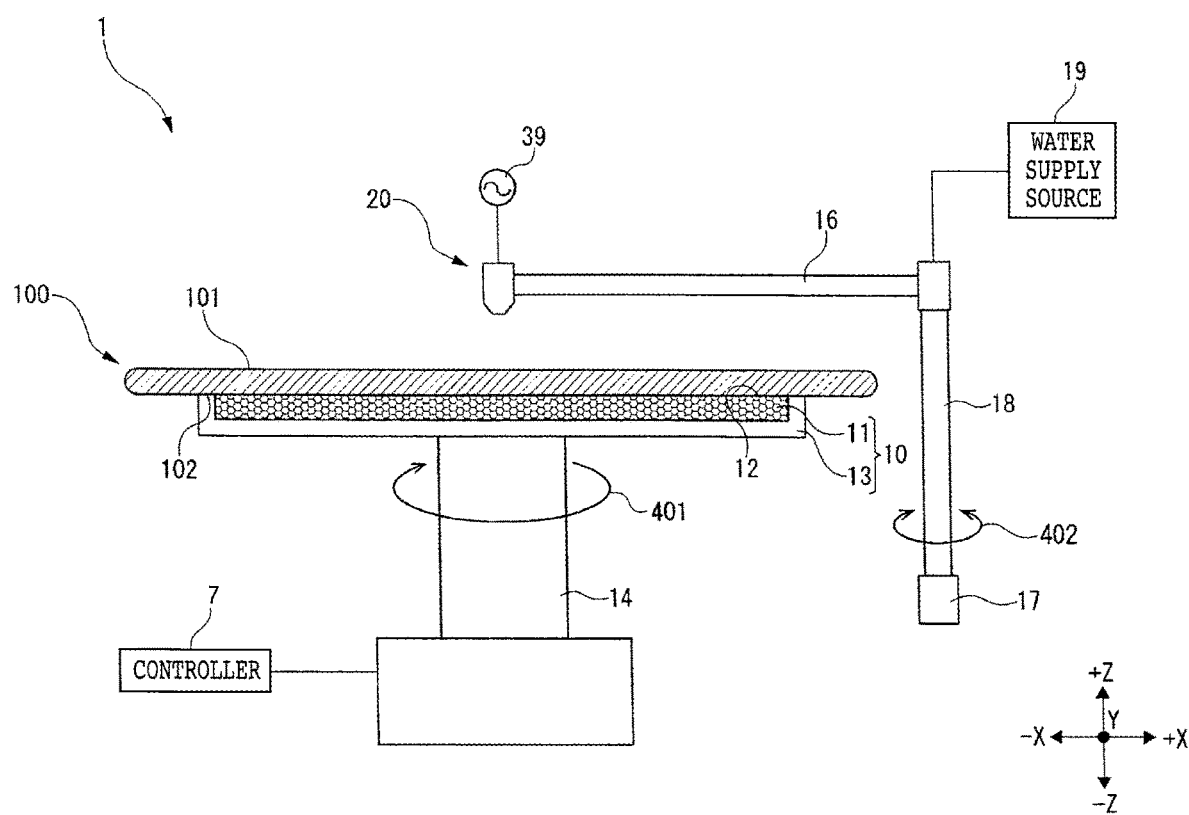
FIG. 1 is a partly cross-sectional side view illustrating a spin cleaning system including an ultrasonically activated water ejector according to an embodiment of the present invention.
Figure 2:
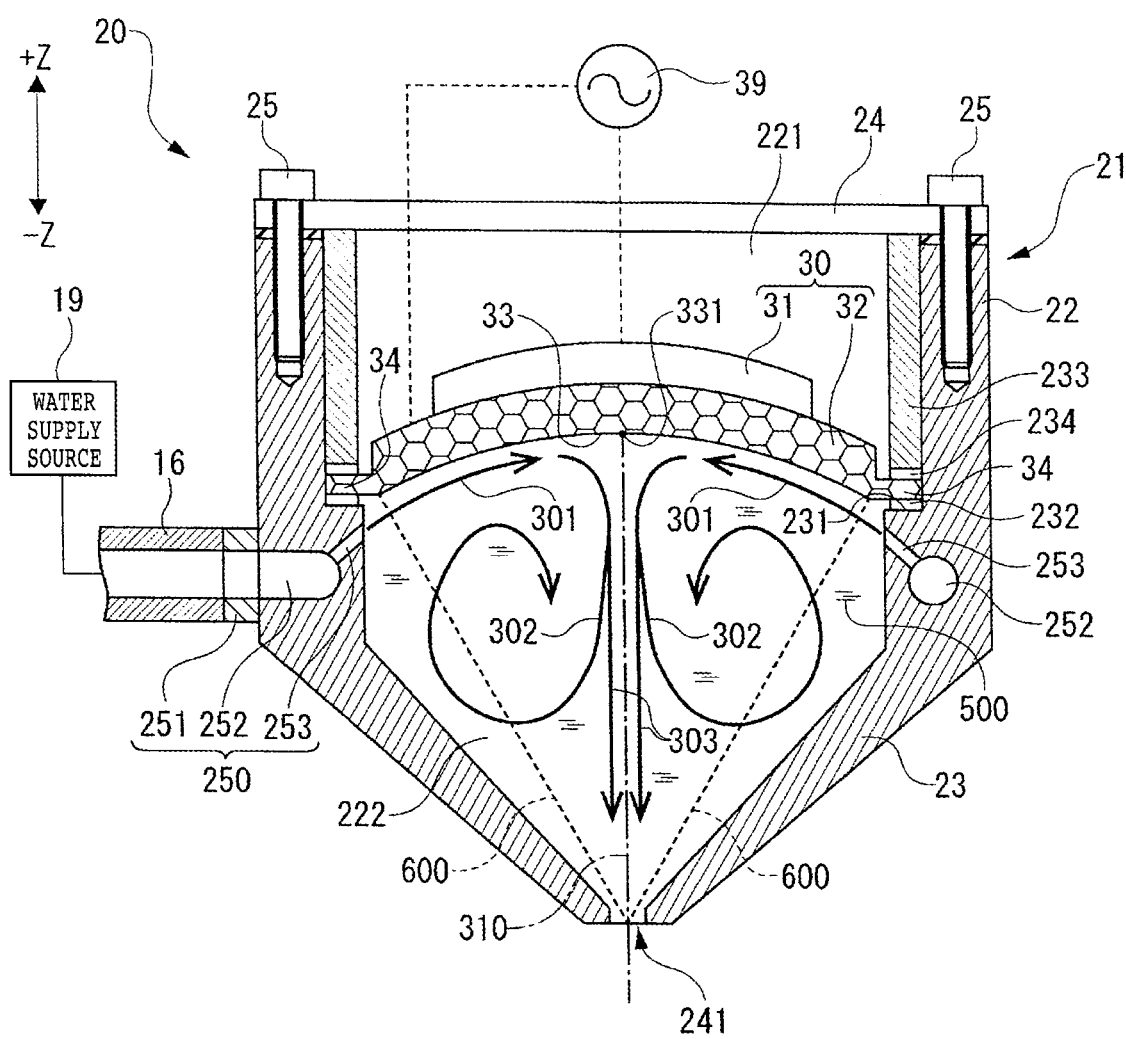
FIG. 2 is a cross-sectional view illustrating a configuration of the ultrasonically activated water ejector in FIG. 1.
Figure 3:
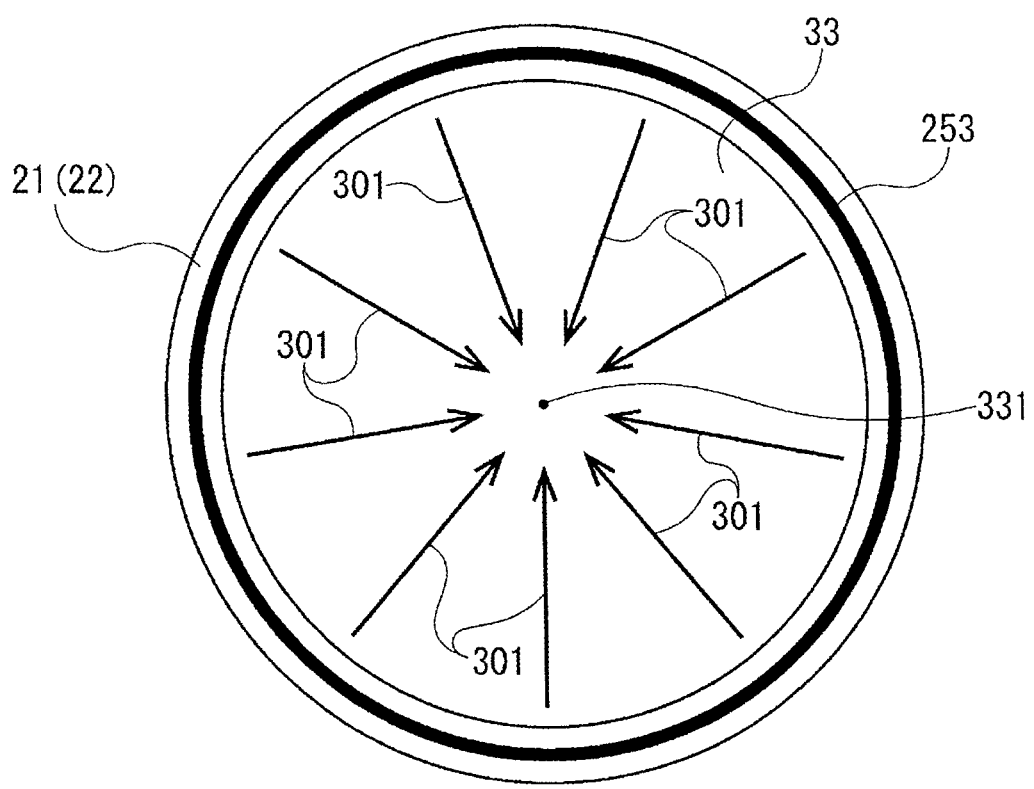
FIG. 3 is a plan view illustrating from above a concave spherical surface and its vicinity in the ultrasonically activated water ejector of FIG. 2.

With reference to FIGS. 1 to 3, an ultrasonically activated water ejector 20 according to an embodiment of the present invention will be described in detail. FIG. 1 is a partly cross-sectional side view illustrating a spin cleaning system 1 including the ultrasonically activated water ejector 20 according to the present embodiment of the present invention, and FIG. 2 is a cross-sectional view illustrating the configuration of the ultrasonically activated water ejector 20 in FIG. 1.

The spin cleaning system 1 illustrated in FIG. 1 includes a spinner table 10 that holds a wafer 100 as a workpiece, the ultrasonically activated water ejector 20 that ejects cleaning water to the wafer 100 held on the spinner table 10, and a controller 7 that controls operation of the spin cleaning system 1.

The wafer 100 is, for example, a circular semiconductor wafer, and an upper surface 101 directed upward in FIG. 1 is a surface to be cleaned. A lower surface 102 of the wafer 100, the lower surface 102 being directed downward in FIG. 1, is protected, for example, by a protective tape (not illustrated) bonded thereto.

The spinner table 10 includes a porous member 11, and a frame body 13 that supports the porous member 11. The porous member 11 can be brought into communication with a suction source (not illustrated) to hold the wafer 100 under suction on a holding surface 12 as an upper surface. As indicated by an arrow 401, the spinner table 10 can be rotated in a horizontal plane by a spinner table rotation mechanism 14 disposed below the spinner table 10.

The ultrasonically activated water ejector 20 is connected to a high-frequency power source 39, and is secured to a front end of a water supply pipe 16 swingable above the spinner table 10. The water supply pipe 16 extends in a horizontal direction, and is connected to a water supply source 19. The water supply source 19 includes a pump and other supply means, and is configured to supply cleaning water such as pure water to the water supply pipe 16.

Connected to a side of a rear end of the water supply pipe 16 is a turnable shaft 18 that can be turned by a swing motor 17. The water supply pipe 16 has a length sufficient to reach at least a center of the spinner table 10 from an upper end of the turnable shaft 18.

In the spin cleaning system 1, accompanied with turning of the turnable shaft 18 (as indicated by an arrow 402) by the swing motor 17, the ultrasonically activated water ejector 20 disposed on the front end of the water supply pipe 16 can move over the wafer 100, which is held on the spinner table 10, from an outer peripheral edge to a center of the wafer 100.

The ultrasonically activated water ejector 20 is a device that ejects ultrasonically activated water with ultrasonic vibrations propagated thereto. As illustrated in FIG. 2, the ultrasonically activated water ejector 20 includes a casing 21, an ejection nozzle 241, a dome-shaped ultrasonic vibration plate 30, and a water supply portion 250. The casing 21 has a second compartment 222 as a water reservoir section, in which cleaning water 500 supplied from the water supply source 19 via the water supply pipe 16 is temporarily held. The ejection nozzle 241 ejects the cleaning water 500. The dome-shaped ultrasonic vibration plate 30 is disposed in an upper part of the second compartment 222 of the casing 21. The water supply portion 250 supplies the cleaning water 500 into the second compartment 222 of the casing 21.

The casing 21 includes a cylindrical section 22, a conical cylindrical nozzle section 23 formed below and integrally with the cylindrical section 22, a top plate 24 closing an upper part of the cylindrical section 22, and fastening members 25 fixing the top plate 24 to the cylindrical section 22.

The casing 21 is internally divided by the ultrasonic vibration plate 30 into two compartments, one over the other, specifically a first compartment 221 on an upper side of the ultrasonic vibration plate 30, and the second compartment 222 on a lower side of the ultrasonic vibration plate 30. At a position in the cylindrical section 22, the position corresponding to the second compartment 222, the water supply portion 250 is formed, and to the water supply portion 250, the water supply source 19 is connected via the water supply pipe 16. The cleaning water 500 supplied from the water supply source 19 is therefore temporarily held in the second compartment 222 that is the cylindrical (conical cylindrical) water reservoir section of the casing 21.

The nozzle section 23 of the casing 21 is formed at a lower end of the cylindrical section 22 such that the nozzle section 23 protrudes toward-Z direction. The nozzle section 23 gradually decreases in diameter toward a distal end thereof. The nozzle section 23 includes at the distal end thereof the ejection nozzle 241 that ejects the cleaning water 500, which is held in the second compartment 222 of the casing 21, from a lower part of the second compartment 222. The second compartment 222 of the casing 21 is formed from an inside of the nozzle section 23 and an inside of the cylindrical section 22, the latter inside being on a lower side of the ultrasonic vibration plate 30.

The ultrasonic vibration plate 30 is disposed in an upper part of the second compartment 222 as the water reservoir section, faces the ejection nozzle 241, and has a dome shape defining a concave spherical surface on the lower side thereof. The ultrasonic vibration plate 30 is configured to generate ultrasonic vibrations upon input of high-frequency power. The ultrasonic vibration plate 30 therefore propagates ultrasonic vibrations to the cleaning water 500 held in the second compartment 222 of the casing 21.

The ultrasonic vibration plate 30 includes a first electrode plate 31 and a second electrode plate 32.

The second electrode plate 32 is a main body portion of the ultrasonic vibration plate 30. The second electrode plate 32 is formed to have a circular dome shape as seen in a top view, and has a lower surface facing the ejection nozzle 241 and formed as a downward concave spherical surface (radiation surface) 33. In other words, the ejection nozzle 241 is disposed facing the concave spherical surface 33. The concave spherical surface 33 radiates ultrasonic vibrations toward the cleaning water 500 supplied to and held between the ultrasonic vibration plate 30 and the ejection nozzle 241.

The second electrode plate 32 also has, at an outer peripheral portion thereof, a flange portion 34 extending outward in a radial direction. The flange portion 34 is mounted on a base portion 231, which is arranged in an inner wall of the cylindrical section 22 of the casing 21, via a first electric member 232 made, for example, of a rubber plate. Further, the flange portion 34 is pressed from above by a fixing member 233, which is secured to the inner wall of the cylindrical section 22, via a second elastic member 234 made, for example, of a rubber plate. With the flange portion 34 held between the base portion 231 and the fixing member 233, the second electrode plate 32 with the flange portion 34 included therein is therefore fixed on the inner wall of the cylindrical section 22.

The first electrode plate 31 has a similar circular dome shape as the second electrode plate 32, and is smaller in diameter than the second electrode plate 32. The first electrode plate 31 is stacked on the second electrode plate 32 such that its lower surface is kept in close contact with an upper surface of the second electrode plate 32.

The first electrode plate 31 and the second electrode plate 32 are each configured, for example, of a piezoelectric element which is a ceramic material. The first electrode plate 31 and the second electrode plate 32 are each electrically connected to the high-frequency power source 39.

The water supply portion 250 is used to supply the cleaning water 500 to the second compartment 222 defined between the ultrasonic vibration plate 30 and the ejection nozzle 241 in the casing 21.

The water supply portion 250 is disposed at a lower end of the cylindrical section 22 in the casing 21. The water supply portion 250 has a connecting portion 251 disposed on the outer wall of the cylindrical section 22, an annular water channel 252 communicated to the connecting portion 251, and an annular supply inlet 253 extending, as a supply inlet, from the annular water channel 252 to the second compartment 222 inside the cylindrical section 22.

To the connecting portion 251, the water supply pipe 16 is connected. The connecting portion 251 supplies, to the annular water channel 252, the cleaning water 500 that flows in from the water supply source 19 via the water supply pipe 16.

The annular water channel 252 is a ring-shaped hollow space, and is disposed in an annular shape surrounding an entire periphery of the second compartment 222 in the side wall at the lower end of the cylindrical section 22. The annular water channel 252 is connected at a portion thereof to the connecting portion 251, and is configured to be supplied with the cleaning water 500 from the water supply source 19 via the water supply pipe 16 and the connecting portion 251. The cleaning water 500 supplied to the annular water channel 252 spreads over an entire periphery of the annular water channel 252, and is supplied from the annular supply inlet 253 into the second compartment 222.

The annular supply inlet 253 opens in an annular shape into the second compartment 222 as the water reservoir section. Described specifically, the annular supply inlet 253 is an annular slit formed to extend in an obliquely upward direction through the side wall of the cylindrical section 22 from the entire periphery of the annular water channel 252 toward the second compartment 222, and opens below the ultrasonic vibration plate 30 in the second compartment 222. The annular supply inlet 253 supplies the cleaning water 500 into the second compartment 222 along the concave spherical surface 33 of the second electrode plate 32 from an outer periphery toward a center of the ultrasonic vibration plate 30.

The controller 7 illustrated in FIG. 1 controls desired members of the spin cleaning system 1 to perform cleaning operation on the wafer 100 held on the spinner table 10. A description will hereinafter be made about the cleaning operation for the wafer 100 by the spin cleaning system 1.

First, an operator places the wafer 100 on the holding surface 12 of the spinner table 10. The controller 7 then actuates the suction source (not illustrated) to apply a suction force to the holding surface 12. As a consequence, the holding surface 12 holds the wafer 100 under suction.

Using the spinner table rotation mechanism 14, the controller 7 then rotates the spinner table 10 in the direction of the arrow 401. Using the swing motor 17, the controller 7 also turns the turnable shaft 18 as indicated by the arrow 402, whereby the ultrasonically activated water ejector 20 is moved from a retracted position outside the spinner table 10 to above the wafer 100. As a consequence, the ejection nozzle 241 of the ultrasonically activated water ejector 20 faces the upper surface 101 of the wafer 100.

Subsequently, the controller 7 begins to deliver the cleaning water 500 from the water supply source 19. The cleaning water 500 is supplied through the water supply pipe 16 to the annular water channel 252 via the connecting portion 251 of the water supply portion 250 illustrated in FIG. 2. The cleaning water 500 supplied to the annular water channel 252 spreads over the entire periphery of the annular water channel 252. The cleaning water 500 is then supplied (ejected) from the annular supply inlet 253 into the second compartment 222.

As described above, the annular supply inlet 253 is the annular slit extending in the obliquely upward direction from the entire periphery of the annular water channel 252 toward the second compartment 222, and opens below the ultrasonic vibration plate 30 in the second compartment 222. Accordingly, the cleaning water 500 supplied from the annular supply inlet 253 flows along the concave spherical surface 33 of the second electrode plate 32 from the outer periphery to the center of the concave spherical surface 33, and is held in the second compartment.

Now, FIG. 3 is a plan view illustrating from above the concave spherical surface 33 and its vicinity in the ultrasonically activated water ejector 20 of FIG. 2. Described specifically, as indicated by arrows 301 in FIGS. 2 and 3, the cleaning water 500 supplied from the annular supply inlet 253 flows along the concave spherical surface 33 from the entirety of the outer periphery toward a central portion 331 of the concave spherical surface 33, and is supplied to and held in the second compartment 222. In other words, the cleaning water 500 supplied from the outer periphery toward the central portion 331 of the concave spherical surface 33 flows downward from the central portion 331, and is progressively held in the second compartment 222.

In the second compartment 222, a portion of the cleaning water 500 forms swirls in the second compartment 222 as indicated by arrows 302 in FIG. 2, and, on the other hand, the remaining portion of the cleaning water 500, as indicated by arrows 303, flows down from the central portion 331 of the concave spherical surface 33 toward the ejection nozzle 241 along a center line 310 of the second compartment 222, the center line 310 passing through the central portion 331 of the concave spherical surface 33 and the ejection nozzle 241, and is ejected downward from the ejection nozzle 241.

It is to be noted that the cleaning water 500 in the second compartment 222 is maintained in a predetermined amount by continued supply of a constant amount of the cleaning water 500 from the water supply source 19. In the present embodiment, the controller 7 supplies the cleaning water 500 to the second compartment 222 via the annular supply inlet 253, for example, in an amount greater than the amount of the cleaning water 500 to be ejected from the ejection nozzle 241.

Here, the controller 7 ejects ultrasonically activated water, which has been obtained by propagating ultrasonic vibrations to the cleaning water 500, from the ejection nozzle 241.

Described specifically, the controller 7 controls the high-frequency power source 39 to supply high-frequency power to the first electrode plate 31 and the second electrode plate 32 of the ultrasonic vibration plate 30. Described specifically, the controller 7 repeats on-off switching of the impression of a voltage at a predetermined frequency (for example, 1 to 3 MHZ) via the high-frequency power source 39, thereby causing the first electrode plate 31 to undergo expansion and contraction motion in an up-and-down direction. This expansion and contraction motion then turns into mechanical ultrasonic vibrations.

The second electrode plate 32 resonates with vibrations of the first electrode plate 31, thereby propagating ultrasonic vibrations 600 from the concave spherical surface 33, which is a concave surface gently recessed as seen from a side of the ejection nozzle 241, to the cleaning water 500 held in the second compartment 222. The ultrasonic vibrations 600 propagated from the concave spherical surface 33 to the cleaning water 500 then concentrate toward the ejection nozzle 241.

These ultrasonic vibrations 600 are focused on the upper surface 101 of the wafer 100 positioned at a predetermined height, for example, within a range of several to several tens of millimeters below the ejection nozzle 241, and are allowed to concentrate at the position. In other words, the focal point of the ultrasonic vibrations 600 is formed on the upper surface 101 of the wafer 100 illustrated in FIG. 1.

Owing to such propagation of the ultrasonic vibrations 600, the cleaning water 500 with the ultrasonic vibrations 600 propagated thereto, that is, the ultrasonically activated water can be ejected from the ejection nozzle 241 toward the upper surface 101 of the wafer 100. The upper surface 101 of the wafer 100 can hence be cleaned with the ultrasonically activated water.

In the ultrasonically activated water ejector 20 of the present embodiment, the cleaning water 500 supplied from the annular supply inlet 253 into the second compartment 222 as the water reservoir section flows along the concave spherical surface 33 from the outer periphery toward the center of the concave spherical surface 33 as indicated by the arrows 301 in FIG. 2, and is supplied to the second compartment 222, as described above.

Even if air is trapped around the central portion 331 of the downward concave spherical surface 33, it is therefore possible to remove the air from the concave spherical surface 33 with a stream of the cleaning water 500 that is flowing from the outer periphery to the center of the concave spherical surface 33, and to discharge it along with the cleaning water 500 from the ejection nozzle 241.

As described above, it is possible in the present embodiment to suppress air from being trapped underneath the concave spherical surface 33 of the ultrasonic vibration plate 30. Ultrasonic vibrations can therefore be transmitted well by the concave spherical surface 33 to the cleaning water 500 held in the second compartment 222, so that ultrasonically activated water with ultrasonic vibrations propagated sufficiently thereto can be ejected from the ejection nozzle 241. As a reduction in the cleaning performance of the ultrasonically activated water can be suppressed, the wafer 100 can be cleaned well with the ultrasonically activated water.

Figure 4:
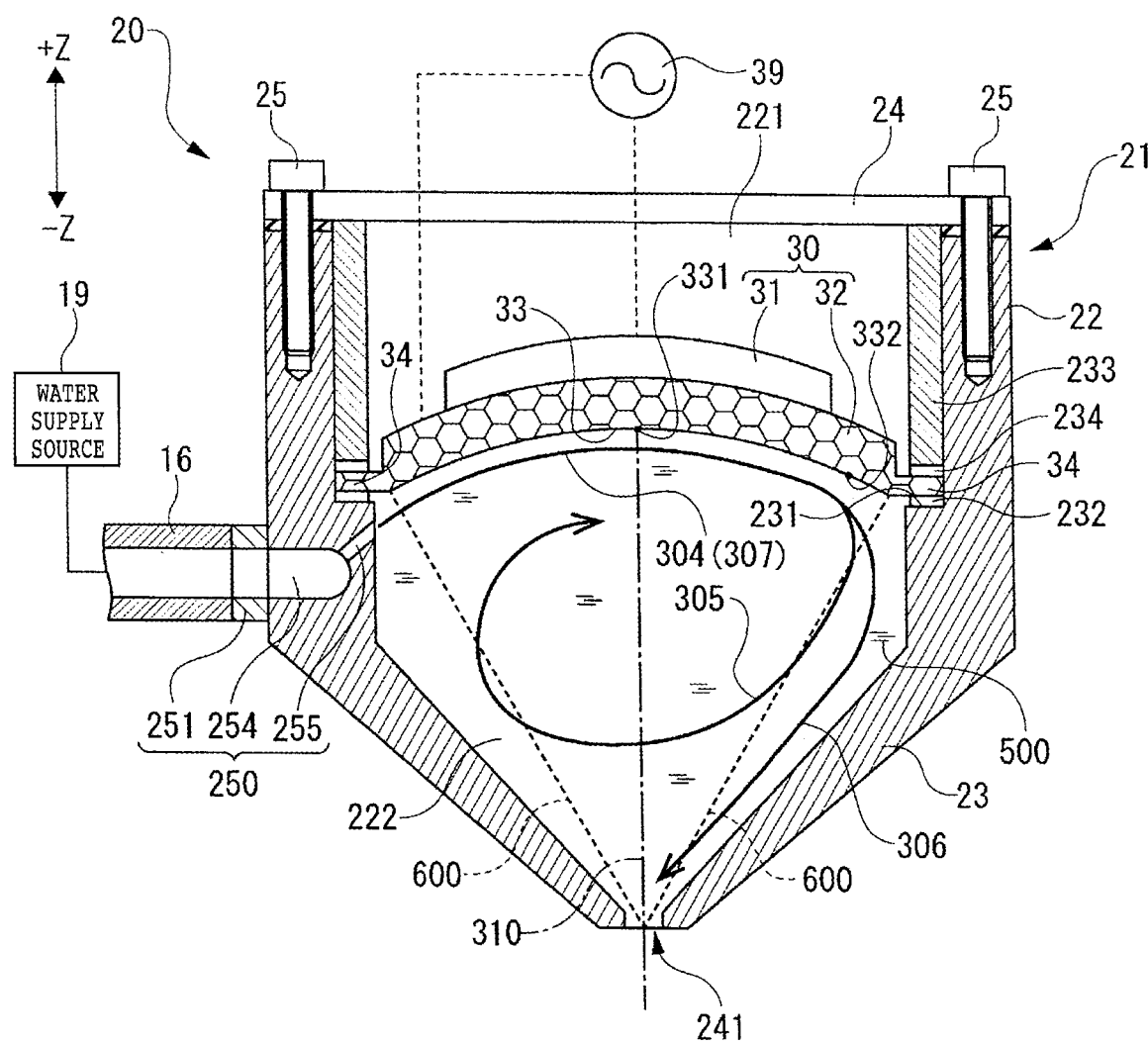
FIG. 4 is a cross-sectional view illustrating a first modification of the ultrasonically activated water ejector of FIG. 2.
Figure 5:
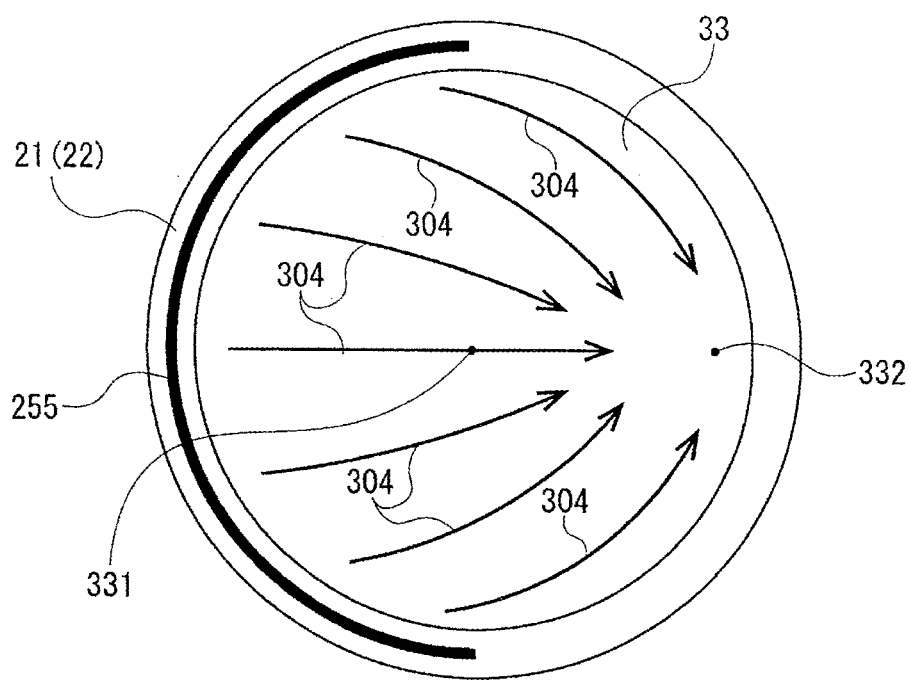
FIG. 5 is a plan view illustrating from above a concave spherical surface and its vicinity in the first modification of FIG. 4.

FIG. 4 is a cross-sectional view illustrating a first modification of the ultrasonically activated water ejector 20 of FIG. 2, and FIG. 5 is a plan view illustrating from above the concave spherical surface 33 and its vicinity in the first modification of FIG. 4. In the first modification, the water supply portion 250 includes an arcuate water channel 254 and an arcuate supply inlet 255 in place of the annular water channel 252 and the annular supply inlet 253 as illustrated in FIGS. 4 and 5.

The arcuate water channel 254 is a semiannular hollow space, and is disposed surrounding one half of the periphery of the second compartment 222 in the side wall at the lower end of the cylindrical section 22. The arcuate water channel 254 is connected at a portion thereof to the connecting portion 251, and is configured to be supplied with the cleaning water 500 from the water supply source 19 via the water supply pipe 16 and the connecting portion 251. The cleaning water 500 supplied to the arcuate water channel 254 spreads over an entirety of the arcuate water channel 254, and is supplied from the arcuate supply inlet 255 into the second compartment 222.

The arcuate supply inlet 255 opens in a semicylindrical surface shape, which has a small height in +Z to −Z direction, into the second compartment 222 as the water reservoir section. Described specifically, the arcuate supply inlet 255 is an arcuate slit formed to extend in an obliquely upward direction through the side wall of the cylindrical section 22 from the entirety of the arcuate water channel 254 toward the second compartment 222, and opens below the ultrasonic vibration plate 30 in the second compartment 222. The arcuate supply inlet 255 supplies the cleaning water 500 into the second compartment 222 along the concave spherical surface 33 of the second electrode plate 32 from the outer periphery toward the center of the ultrasonic vibration plate 30.

As indicated by arrows 304 in FIGS. 4 and 5, the cleaning water 500 supplied from the arcuate supply inlet 255 then flows along the concave spherical surface 33 from one half of the outer periphery toward the central portion 331 of the concave spherical surface 33, and is supplied to and held in the second compartment 222. In other words, the cleaning water 500 flows out of the arcuate supply inlet 255, reaches an end portion 332 on the concave spherical surface 33, the end portion 332 being located remote from the arcuate supply inlet 255, flows downward from the end portion 332, and is then progressively held in the second compartment 222.

In the second compartment 222, a portion of the cleaning water 500 then forms a swirl as indicated by an arrow 305 in FIG. 4, and, on the other hand, the remaining portion of the cleaning water 500, as indicated by an arrow 306, flows down along an inner wall of the nozzle section 23 from the end portion 332 of the concave spherical surface 33 toward the ejection nozzle 241, and is ejected downward from the ejection nozzle 241.

Figure 6:
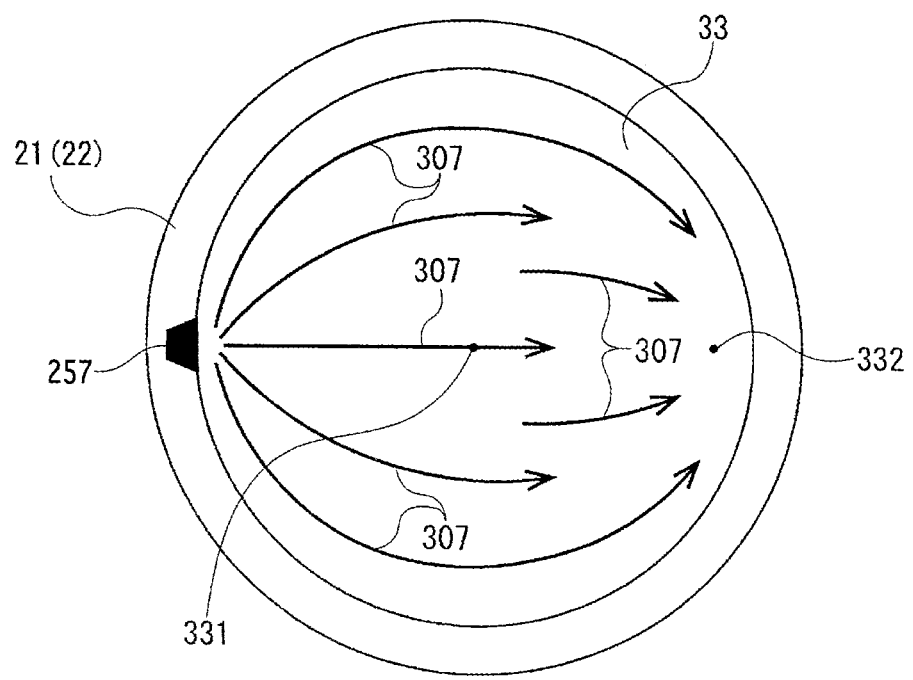
FIG. 6 is a plan view illustrating from above a concave spherical surface and its vicinity in a second modification of the ultrasonically activated water ejector of FIG. 2.

In the first modification, the arcuate water channel 254 may be a flow channel shorter than the semiannular shape, and the arcuate supply inlet 255 may also open into the second compartment 222 as the water reservoir section over a length shorter in a peripheral direction than the semicylindrical surface. Such a modification of the above-described embodiment will hereinafter be described as a second modification with reference to FIG. 6. FIG. 6 is a plan view illustrating from above the concave spherical surface 33 and its vicinity in the second modification. In the second modification, the cleaning water 500 supplied from a short arcuate supply inlet 257 flows along the concave spherical surface 33 from a portion toward the central portion 331 of the concave spherical surface 33 as indicated by arrows 307 in FIG. 6, and is supplied to and held in the second compartment 222. In other words, the cleaning water 500 flows out of the short arcuate supply inlet 257, reaches the end portion 332 on the concave spherical surface 33, the end portion 332 being located remote from the short arcuate supply inlet 257, flows downward from the end portion 332, and is then progressively held in the second compartment 222. It is to be noted that, in place of the short arcuate supply inlet 257, a plurality of apertures may be disposed at intervals in the peripheral direction.

In the second modification, a portion of the cleaning water 500 also forms a swirl in much the same way as indicated by the arrow 305 in FIG. 4, and, on the other hand, the remaining portion of the cleaning water 500, in much the same way as indicated by the arrow 306 in FIG. 4, flows down along the inner wall of the nozzle section 23 from the end portion 332 of the concave spherical surface 33 toward the ejection nozzle 241, and is ejected downward from the ejection nozzle 241.

In the configurations illustrated in FIGS. 4 to 6, a portion of the cleaning water 500 supplied into the second compartment 222 also flows along the concave spherical surface 33 from the outer periphery toward the center of the concave spherical surface 33. It is therefore possible to remove air, which has been trapped underneath the concave spherical surface 33, with the stream of the cleaning water 500, and to discharge it along with the cleaning water 500 from the ejection nozzle 241. It is therefore possible to suppress air from being trapped underneath the concave spherical surface 33, and also to transmit ultrasonic vibrations well by the concave spherical surface 33 to the cleaning water 500 held in the second compartment 222.

The ultrasonically activated water ejector 20 according to the present embodiment can also be applied to a system, apparatus, or machine other than the spin cleaning system 1. For example, the ultrasonically activated water ejector 20 can be used in what is called a Key Amorphous-Black Repetitive Absorption (KABRA) process. The KABRA process is a processing technique that continuously and vertically irradiates a laser from an upper surface of an ingot to form a separation layer (KABRA layer) in the ingot and separates or slices a portion of the ingot as a wafer while using the KABRA layer as a starting point. The portion of the ingot can be separated or sliced with ease by ejecting ultrasonically activated water to the ingot, in which the KABRA layer has been formed, with use of the ultrasonically activated water ejector 20.

The ultrasonically activated water ejector 20 can also be used in what is called laser lift-off processing. Laser lift-off processing is a processing technique that irradiates a laser of high output power to a workpiece to heat and decompose the workpiece at an interface thereof and separates or slices a portion of the workpiece as a wafer while using the interface as a boundary. The ejection of ultrasonically activated water to a workpiece, in which an interface has been formed, with the use of the ultrasonically activated water ejector 20 can separate or slice a portion of the workpiece with ease.

It is to be noted that the concave spherical surface 33 of the ultrasonic vibration plate 30 (second electrode plate 32) may be formed in a dome shape such that it forms a part of a substantially spherical surface, or may be formed in a dome shape such that it forms an inner surface of an inverted cone. In other words, the concave spherical surface 33 is required to be configured such that ultrasonic vibrations concentrate toward the ejection nozzle 241.

In the present embodiment described above, the nozzle section 23 of the casing 21 is formed in a conical cylindrical shape gradually reduced in diameter toward the ejection nozzle 241. In this respect, the nozzle section 23 may have a cylindrical shape not reduced in diameter toward the ejection nozzle 241.

The present invention is not limited to the details of the above-described preferred embodiment. The scope of the invention is defined by the appended claims and all changes and modifications as fall within the equivalence of the scope of the claims are therefore to be embraced by the invention.

What is claimed is:

1. An ultrasonically activated water ejector for ejecting ultrasonically activated water with ultrasonic vibrations propagated thereto, comprising:
   a cylindrical water reservoir section configured to temporarily hold water supplied from a water supply source;
   an ejection nozzle that ejects the water from a lower part of the water reservoir section;
   a dome-shaped ultrasonic vibration plate disposed in an upper part of the water reservoir section, facing the ejection nozzle, and having a concave spherical surface on a lower side thereof; and
   a water supply portion having a supply inlet configured to be a slit which extends obliquely through a vertical sidewall of the cylindrical water reservoir section to supply the water along the concave spherical surface into the water reservoir section from an outer periphery toward a center of the ultrasonic vibration plate,
   wherein the water is supplied from the supply inlet to the water reservoir section in an amount greater than the water to be ejected from the ejection nozzle,
   the water flows along the concave spherical surface from an outer periphery toward a center of the concave spherical surface, and is held in the water reservoir section, and
   the ultrasonically activated water is obtained by propagating ultrasonic vibrations from the ultrasonic vibration plate to the water held in the water reservoir section, and is ejected from the ejection nozzle.

2. The ultrasonically activated water ejector according to claim 1,
   wherein the supply inlet is an annular supply inlet opening in a ring shape into the water reservoir section, and
   the annular supply inlet, the concave spherical surface, and the water reservoir section are configured such that the water supplied from the annular supply inlet into the water reservoir section flows along the concave spherical surface from an entirety of the outer periphery toward the center of the concave spherical surface, is held in the water reservoir section, and is allowed to flow downward from the center of the concave spherical surface toward the ejection nozzle, and
   the ultrasonic vibrations are allowed to propagate to the water held in the water reservoir section, and the resulting ultrasonically activated water is ejected from the ejection nozzle.

3. The ultrasonically activated water ejector according to claim 1, wherein the water supply portion further includes a connecting portion disposed on an outer wall of the cylindrical water reservoir section, and a water channel communicated to the connecting portion, the supply inlet extending from the water channel, such that the water channel is an arcuate semi-annular hollow space, and is disposed in the side wall of the cylindrical water reservoir section surrounding one half of a periphery of the cylindrical water reservoir section.

4. The ultrasonically activated water ejector according to claim 1, wherein the water supply portion further includes a connecting portion disposed on an outer wall of the cylindrical water reservoir section, and a water channel communicated to the connecting portion, the supply inlet extending from the water channel, such that the water channel is an annular ring-shaped hollow space, and is disposed in the side wall of the cylindrical water reservoir section surrounding an entirety of a periphery of the cylindrical water reservoir section.

5. The ultrasonically activated water ejector according to claim 1, wherein the ultrasonic vibration plate includes, at an outer peripheral portion thereof, a flange portion extending outward in a radial direction, the flange portion being mounted in a recess of the vertical side wall of the cylindrical water reservoir section such that first and second elastic members are disposed above and below the flange portion, respectively.

* * * * *